United States Patent [19]

Hayashi

[11] 4,119,910
[45] Oct. 10, 1978

[54] METHOD AND APPARATUS FOR DETECTING WHETHER PHASE DIFFERENCE BETWEEN TWO SIGNALS IS CONSTANT

[75] Inventor: Kiyoshi Hayashi, Nagoya, Japan

[73] Assignee: Shin Shirasuna Electric Corp., Nagoya, Japan

[21] Appl. No.: 777,508

[22] Filed: Mar. 14, 1977

[30] Foreign Application Priority Data

Mar. 18, 1976 [JP] Japan .................... 51-29515

[51] Int. Cl.² ............................................ G01R 25/00
[52] U.S. Cl. ................................ 324/83 R; 324/83 D;
328/133; 328/134
[58] Field of Search ........................ 324/83 R, 83 D; 328/133, 134, 141; 307/232

[56] References Cited

U.S. PATENT DOCUMENTS

| | | | |
|---|---|---|---|
| 3,200,340 | 8/1965 | Dunne | 324/83 D |
| 3,205,438 | 9/1965 | Buck | 324/83 A |
| 3,328,688 | 6/1967 | Brooks | 328/133 |
| 3,509,476 | 4/1970 | Roth | 328/134 |
| 3,521,172 | 7/1970 | Harmon | 328/133 |
| 3,663,884 | 5/1972 | Pattantyus | 328/134 |

*Primary Examiner*—M. Tokar

[57] ABSTRACT

A method and apparatus for detecting whether the phase difference between a first and a second signal is constant or not. A Q output and $\bar{Q}$ output are derived from a set-reset flip-flop circuit by imparting thereto a first and a second trigger pulse which are respectively obtained on the basis of said first and second signals. Subsequently, on the basis of said Q and $\bar{Q}$ outputs, there are produced two pulse signals the fall portions of which correspond to those of said Q and $\bar{Q}$ outputs respectively but the rise portions of which are caused to occur while being delayed by a period of time corresponding to the duration of said trigger pulses. Thereafter, there are produced logical products of said first and second pulse signals with respect to said first and second trigger pulses. Thus, it is detected whether the phase difference between said first and second signals is constant or not, according to whether the outputs of said logical products are present or not.

2 Claims, 4 Drawing Figures

(A)

(B)

(C)

METHOD AND APPARATUS FOR DETECTING WHETHER PHASE DIFFERENCE BETWEEN TWO SIGNALS IS CONSTANT

This invention relates to a method and apparatus for detecting whether difference in phase between two signals is constant.

In order to detect whether difference in phase between two signals is constant, there have conventionally been proposed, among others, a system in which beat between the two signals is produced and a system in which an exclusive logical sum (exclusive "or") of the two signals is produced and thus it is detected whether the duty ratio of the resultant signal is constant. However, the former system is advantageous in that the accuracy thereof is low, and the latter system is also disadvantageous in that the circuit arrangement thereof is highly complicated and expensive.

Accordingly, it is an object of this invention to provide a method and apparatus designed so that it is possible to detect whether difference in phase between two signals is constant, by the use of a simplified circuit arrangement which can be constructed at low cost and is operable with a high accuracy.

Other objects, features and advantages of this invention will become apparent from the following description taken in conjunction with the accompanying drawings.

Figure 1:
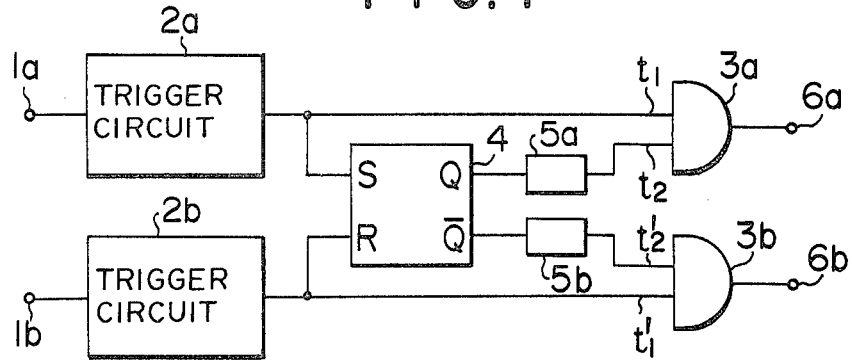
FIG. 1 is a view showing an example of the circuit arrangement capable of carrying out this invention.

Referring now to FIG. 1 of the drawings, there is illustrated an example of the circuit arrangement which is so designed as to carry out this invention. Designated by 1a and 1b are input terminals to which are respectively applied pulses such as shown at (a) and (b) in FIG. 2(A) which are respectively derived by suitably shaping a first and a second signal which are to be compared with each other in respect of phase. There are provided trigger circuits 2a and 2b each of which may be constituted by a differentiator circuit and mono-multivibrator circuit for example. The output of the trigger circuit 2a is coupled to one input terminal $t_1$ of an AND circuit 3a and also to the set input terminal S of a set-reset flip-flop circuit 4. The output of the trigger circuit 2b is coupled to one input terminal $t_1$40 of another AND circuit 3b and also to the reset input terminal R of the aforementioned flip-flop circuit 4. Furthermore, the Q output of the flip-flop circuit 4 is connected with the other input terminal $t_2$ of the AND circuit 3a through a delay circuit 5a which will be described hereinafter, and the $\overline{Q}$ output thereof is coupled to the other input terminal $t_2'$ of the AND circuit 3b through a delay circuit 5b which will also be described hereinafter. Designated by 6a and 6b are the output terminals of the AND circuits 3a and 3b respectively.

Description will now be made of the operation of this invention. As will be apparent from the foregoing explanation, the pulses applied to the input terminals 1a and 1b will be fed to the trigger circuits 2a and 2b so that the latters will provide trigger pulses. Subsequently, the output of the trigger circuit 2a will be applied to the set input terminal S of the flip-flop circuit 4, and the output of the trigger circuit 2b will be provided to the reset input terminal R of the flip-flop circuit 4. At the same time, the output of the trigger circuit 2a will be applied to the one input terminal $t_1$ of the AND circuit 3a, and the output of the trigger circuit 2b will be applied to the one input terminal $t_1'$ of the AND circuit 3b. The Q and $\overline{Q}$ outputs of the flip-flop circuit 4 will be provided to the other input terminals $t_2$ and $t_2'$ of the AND circuits 3a and 3b through the delay circuits 5a and 5b respectively. The delay circuits 5a and 5b are arranged such that the rise portions of the Q and $\overline{Q}$ outputs available from the flip-flop circuit 4 are prevented from appearing at the output sides of the delay circuits 5a and 5b for the duration time of the pulses available from the trigger circuits 2a and 2b and the fall portions of the delay circuits 5a and 5b are caused to appear in correspondence to said Q and $\overline{Q}$ outputs which are inputs to these delay circuits.

Assume that the difference in phase between the aforementioned first and second signals is constant. Then, as shown at (c) and (d) in FIG. 2(A), the trigger circuits 2a and 2b will alternately appear with a time interval corresponding to the phase difference between the two signals, so that the Q and $\overline{Q}$ outputs of the flip-flop circuits 4 will constitute pulses whose duration corresponds to said phase difference, as shown at (e) and (f) in FIG. 2(A). However, since pulses to be applied to the input terminals $t_2$ and $t_2'$ of the AND circuits 3a and 3b are ones obtained by causing the rise portions of the pulses (e) and (f) shown in FIG. 2(A) to be delayed in the delay circuits 5a and 5b by the duration of the trigger pulses available from the trigger pulses available from the trigger circuits 2a and 2b, it will never happen that signals simultaneously occur at the two input terminals $t_1$, $t_2$ and $t_1'$, $t_2'$ of the AND circuits 3a and 3b; thus, no output will be available at any of the output terminals 6a and 6b of the AND circuits 3a and 3b. In this way, it is possible to detect that the phase difference between the two signals is constant.

Figure 2:
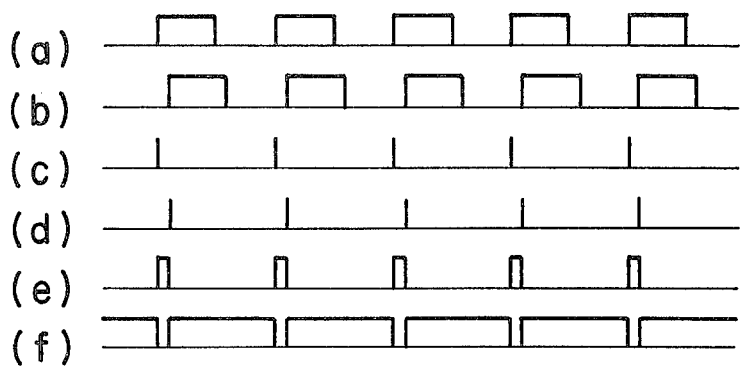
FIG. 2 is a view showing waveforms useful for explaining this invention.
Figure 2:
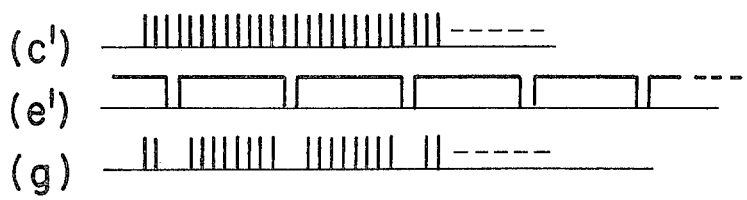
Figure 2:
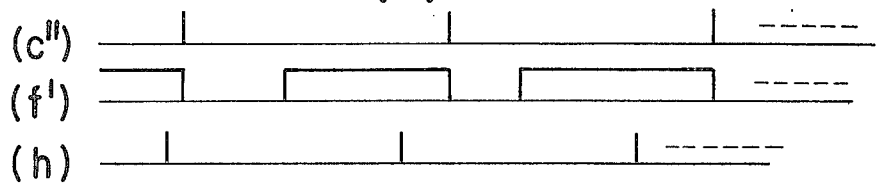

In case the frequency of the aforementioned first signal for example is higher so that the repetition rate of the pulse obtained based on said first signal and to be applied to the input terminal 1a is higher, the trigger circuit 2a will then provide such a trigger pulse as shown at (c') in FIG. 2(B). In such a case, if it is assumed that the frequency of the second signal for example remains the same, then the pulse provided by the other trigger circuit 2b will be similar to that shown at (d) in FIG. 2(A). Thus, the output of the flip-flop circuit 4 will become such as shown at (e') in FIG. 2(B); in this case, due to the presence of the trigger pulse (c') occurring during the duration of the pulse (e'), such a pulse as shown at (g) in FIG. 2(B) will appear at the output terminal 6a of the AND circuit 3a. In this way, it is possible to detect that the phase difference between the aforementioned two signals is constant.

On the other hand, if the frequency of the signal at the input terminal 1a becomes lower, then the trigger circuit 2a will provide such a trigger pulse as shown at (c'') in FIG. 2(C), while the other trigger circuit 2b will provide such a trigger pulse as shown at (d) in FIG. 2(A). Thus, the $\overline{Q}$ output of the flip-flop circuit 4 will constitute such a pulse as shown at (f'); in this case, due to the presence of the pulse (d) occurring during the duration of the pulse (f'), such a pulse as shown at (h) in FIG. 2(C) will appear at the output terminal 6b of the AND circuit 3b. In this way, it is possible to detect that the phase difference between the aforementioned two signals is not constant.

Obviously, what has been described above is equally applicable in case the frequency of the signal at the other input terminal 1b becomes higher or lower.

As will be appreciated from the foregoing explanation, according to this invention, the desired detection can be achieved by a combination of circuits which are available at low cost, so that the circuit arrangement may be a simple and inexpensive one. Furthermore, since all the circuits in use are digital ones, no complex adjustment is required, and yet high accuracy can be realized. Thus, this invention can be utilized in various fields; as will be readily appreciated by those skilled in the art, this invention can be very effectively employed in an attempt to achieve synchronous detection in a so-called phase-locked loop, for example.

While this invention has been described and illustrated with respect to one specific embodiment thereof, it is to be understood that the foregoing description is only exemplary of the invention and various modifications and changes may be made therein within the spirit and scope of the invention as defined in the appended claims.

I claim:

1. A method of detecting whether the difference in phase between a first and a second signal is constant, comprising the steps of deriving a Q output and $\bar{Q}$ output from a set-reset flip-flop circuit by imparting thereto a first and a second trigger pulse which are respectively obtained on the basis of a first and a second signal to be compared with each other in respect of their phase difference; producing, on the basis of said Q and $\bar{Q}$ outputs, two pulse signals the fall portions of which correspond to the fall portions of said Q and $\bar{Q}$ outputs respectively but the rise portions of which are caused to occur while being delayed by a period of time corresponding to the duration of said trigger pulses; and producing logical products of said two pulse signals with respect to said first and second trigger pulses, whereby it is detected whether the phase difference between said first and second signals is constant or not, according to whether the outputs of said logical products are present or not.

2. An apparatus for detecting whether the difference in phase between a first and a second signal is constant, comprising means for deriving a Q output and $\bar{Q}$ output from a set-reset flip-flop circuit by imparting thereto a first and a second trigger pulse which are respectively obtained on the basis of a first and a second signal to be compared with each other in respect of their phase difference; means for producing, on the basis of said Q and $\bar{Q}$ outputs, two pulse signals the fall portions of which correspond to the fall portions of said Q and $\bar{Q}$ outputs respectively but the rise portions of which are caused to occur while being delayed by a period of time corresponding to the duration of said trigger pulses; and means for producing logical products of said two pulse signals with respect to said first and second trigger pulses, whereby it is detected whether the phase difference between said first and second signals is constant or not, according to whether the outputs of said logical products are present or not.

* * * * *